(12) United States Patent
Srinivasan et al.

(10) Patent No.: US 11,081,202 B2
(45) Date of Patent: Aug. 3, 2021

(54) FAILING ADDRESS REGISTERS FOR BUILT-IN SELF TESTS

(71) Applicant: INTERNATIONAL BUSINESS MACHINES CORPORATION, Armonk, NY (US)

(72) Inventors: Uma Srinivasan, Poughkeepsie, NY (US); Thomas J. Knips, Wappingers Falls, NY (US); Gregory J. Fredeman, Wappingers Falls, NY (US); Matthew Steven Hyde, Wappingers Falls, NY (US); Thomas E. Miller, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 17 days.

(21) Appl. No.: 16/589,485

(22) Filed: Oct. 1, 2019

(65) Prior Publication Data
US 2021/0098069 A1    Apr. 1, 2021

(51) Int. Cl.
*G11C 29/38* (2006.01)
*G11C 29/44* (2006.01)

(52) U.S. Cl.
CPC ............ *G11C 29/38* (2013.01); *G11C 29/44* (2013.01)

(58) Field of Classification Search
CPC ................................. G11C 29/38; G11C 29/44
See application file for complete search history.

(56) References Cited

U.S. PATENT DOCUMENTS

| | | | |
|---|---|---|---|
| 5,961,653 A | 10/1999 | Kalter | |
| 6,928,377 B2 | 8/2005 | Eustis | |
| 7,219,275 B2 | 5/2007 | Chang | |
| 8,132,131 B2 | 3/2012 | Barth | |
| 2004/0225939 A1 | 11/2004 | Adams | |
| 2005/0063230 A1* | 3/2005 | Seitoh | G11C 29/38 365/201 |
| 2005/0160310 A1* | 7/2005 | Ellis | G11C 29/74 714/6.32 |
| 2009/0158224 A1* | 6/2009 | Barth, Jr. | G11C 29/72 716/136 |
| 2014/0181456 A1* | 6/2014 | Kwean | G11C 29/88 711/202 |
| 2017/0309349 A1 | 10/2017 | Mondal | |

* cited by examiner

*Primary Examiner* — Thien Nguyen
(74) *Attorney, Agent, or Firm* — Cantor Colburn LLP; Margaret McNamara

(57) ABSTRACT

A computer-implemented method includes receiving a memory address of a memory location in a memory that has been identified to be failing. The method further includes determining that the memory location is from a particular portion of the memory. The method further includes, in response to a number of memory locations that are identified to be failing from the particular portion of the memory being below a predetermined threshold, logging the memory address in a set of failing address registers associated with the memory, otherwise, skipping the logging of the memory address in the failing address registers.

17 Claims, 7 Drawing Sheets

FAILING ADDRESS REGISTERS FOR BUILT-IN SELF TESTS

BACKGROUND

The present invention relates generally to electric circuits, such as computer memory, and more specifically, to improving the efficiency of a failing address register (FAR) used during a built-in self-test (BIST) in the electric circuits.

Modern-day digital signal processors, microprocessors, and network chips process lots of information and store the processed data into memory. Memory typically occupies almost half of the chip area. With decreasing technology nodes, more and more memory cells are closely packed together, thereby increasing the frequency and number of memory faults being detected. Each new technology gives rise to new fault models which require new sets of patterns to test the different kinds of faults in the memories.

A built-in self-test (BIST) mechanism within an integrated circuit (IC) is a function that verifies all or a portion of the internal functionality of the IC. There are many different approaches to architecting memory BIST, each of which has distinct advantages and disadvantages.

SUMMARY

According to one or more embodiments of the present invention, a computer-implemented method includes receiving a memory address of a memory location in a memory that has been identified to be failing. The method further includes determining that the memory location is from a particular portion of the memory. The method further includes, in response to a number of memory locations that are identified to be failing from the particular portion of the memory being below a predetermined threshold, logging the memory address in a set of failing address registers associated with the memory, otherwise, skipping the logging of the memory address in the failing address registers.

According to one or more embodiments of the present invention, a system includes a memory system that includes a plurality of portions. The system further includes memory controller communicatively coupled with the memory system. The memory controller performs a method that includes receiving a memory address of a memory location in a memory that has been identified to be failing. The method further includes determining that the memory location is from a particular portion of the memory. The method further includes, in response to a number of memory locations that are identified to be failing from the particular portion of the memory being below a predetermined threshold, logging the memory address in a set of failing address registers associated with the memory, otherwise, skipping the logging of the memory address in the failing address registers.

According to one or more embodiments of the present invention, a computer program product includes a computer-readable memory that has computer-executable instructions stored thereupon. The computer-executable instructions when executed by a processor cause the processor to perform a method that includes receiving a memory address of a memory location in a memory that has been identified to be failing. The method further includes determining that the memory location is from a particular portion of the memory. The method further includes, in response to a number of memory locations that are identified to be failing from the particular portion of the memory being below a predetermined threshold, logging the memory address in a set of failing address registers associated with the memory, otherwise, skipping the logging of the memory address in the failing address registers.

The above-described features can also be provided at least by a system, a computer program product, and a machine, among other types of implementations.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1A:
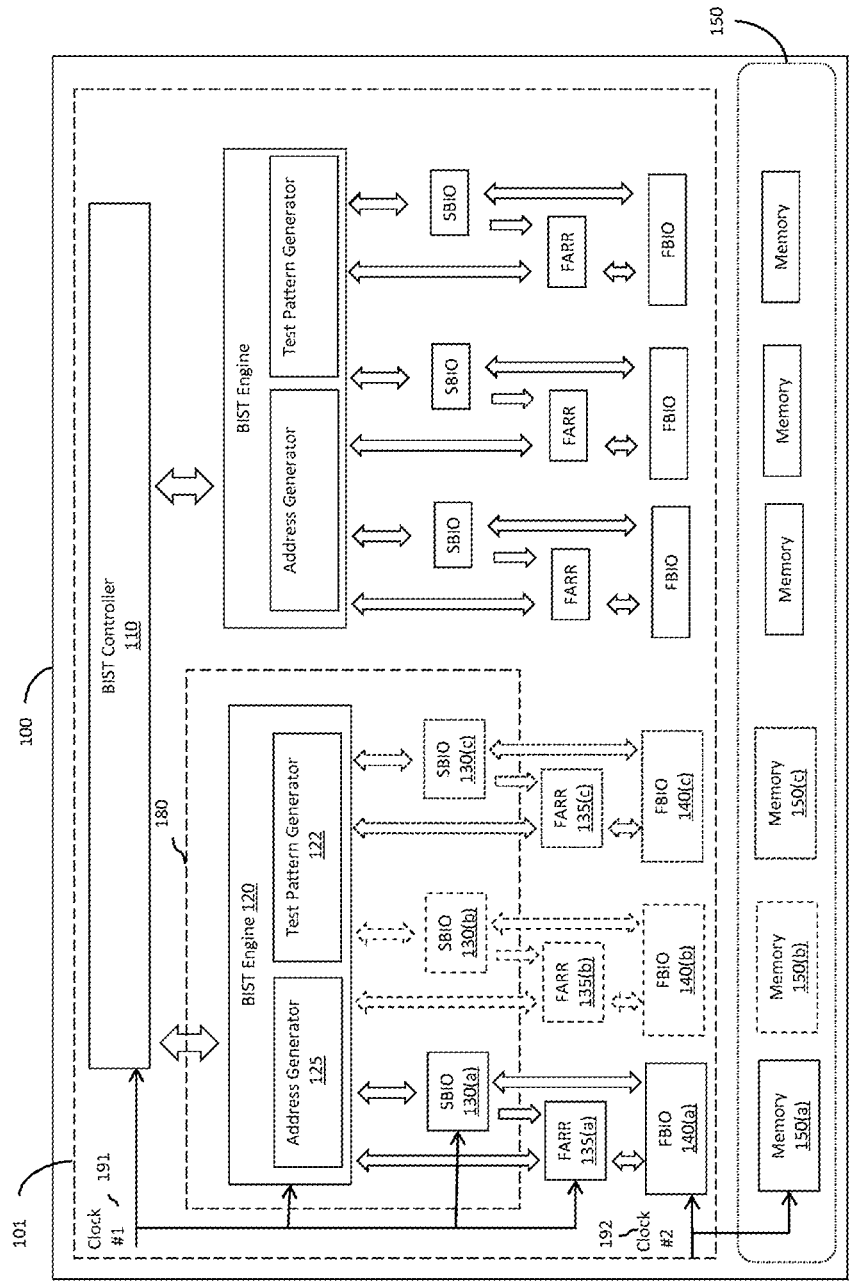
FIG. 1A depicts an integrated chip according to one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

In the accompanying figures and following detailed description of the disclosed embodiments, the various elements illustrated in the figures are provided with two or three-digit reference numbers. With minor exceptions, the leftmost digit(s) of each reference number corresponds to the figure in which its element is first illustrated.

DETAILED DESCRIPTION

With advances in technologies and device scaling, integrated circuit chip designs incorporate an increasingly large number of embedded memories (also referred to herein as embedded memory arrays) as well as built-in self-test (BIST) circuits for testing such embedded memories, when operating in a test mode (as opposed to a functional mode).

Oftentimes an integrated circuit chip design will incorporate multiple BIST engines controlled by a BIST controller and each BIST engine will test multiple embedded memories of the same specific type (e.g., multiple static random access memory arrays (SRAMs), multiple dynamic random access memory arrays (DRAMs), etc.) in parallel. It should be noted that although embodiments of the present invention are described herein using examples of electric circuits that serve as memory block(s), in other embodiments of the present invention the features can be used in any repairable circuit, including but not limited to input/output, logic, SRAM, and DRAM.

A technical challenge with BIST is that when large number of defects are encountered in a memory array that shares a group of failing address registers (FARs) with other memory arrays, the available FARs can fill up preventing from logging further address(es) encountering a failure(s), and in turn preventing estimation of the health of the rest of the memory arrays. Existing solutions to such technical challenges include iteratively testing array elements (separate-array mode) which has the drawback of increased test time. Alternatively, a number of FARs and latches to satisfy the repair coverage of such higher defect rate memory elements has to be increased, leading to larger chips and increased costs.

Embodiments of the present invention described herein facilitate technical solutions that address the above described technical challenges without the drawbacks of the existing solutions. Increased test time due to iteratively testing array elements can be avoided by dynamically blocking out failures from subsections of arrays for which a fail count has exceeded a predetermined threshold limit. One or more embodiments of the present invention facilitate a failed address logic that blocks logging failures beyond the predetermined threshold limit of failures for a specific array segment.

FIG. 1A depicts an integrated chip 100 according to one or more embodiments of the present invention. The integrated circuit chip 100 includes multiple memories 150 and a BIST circuit 101 for testing those memories 150.

Figure 1B:
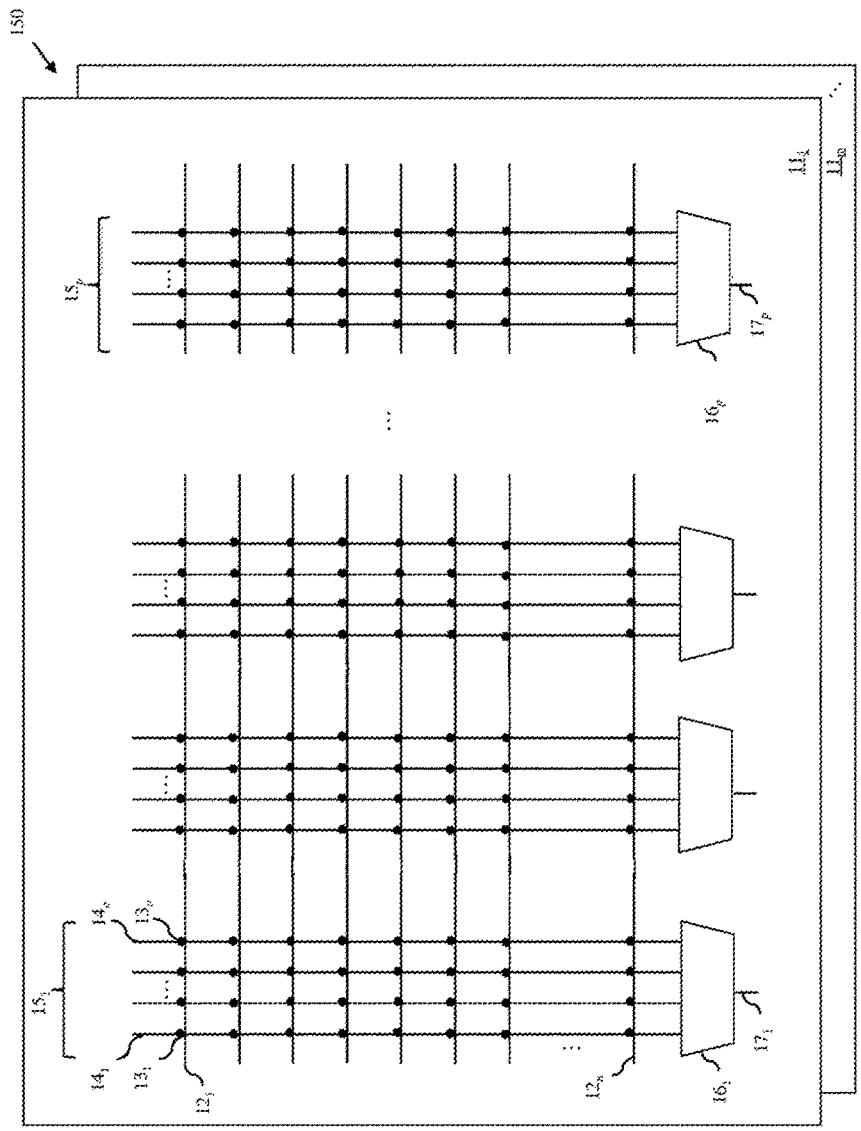
FIG. 1B depicts a memory system according to one or more embodiments of the present invention.

As illustrated in FIG. 1B, each of the memories 150 includes multiple memory banks $11_1$-$11_m$, where the number m is the total number of banks and where each bank is substantially identical. Each memory bank $11_1$-$11_m$ can include multiple word lines $12_1$-$12_n$ (corresponding to rows), where the number n is the total number of word lines per bank. Each memory bank $11_1$-$11_m$ can also include multiple data bit columns $15_1$-$15_p$, where the number p is the total number of data bit columns per bank and where the data bit columns are substantially identical. Each data bit column $15_1$-$15_p$ can traverse the word lines $12_1$-$12_n$ so as to incorporate adjacent sections of the word lines $12_1$-$12_n$.

Each data bit column $15_1$-$15_p$ can further include multiple memory cells $13_1$-$13_q$ that are electrically connected to each of the adjacent sections of the word lines $12_1$-$12_n$ and at least one of the bit lines $14_1$-$14_q$ (corresponding to columns) electrically connected to the memory cells $13_1$-$13_q$, respectively, at the adjacent sections of the word lines $12_1$-$12_n$. Accordingly, the number q corresponds to the number of memory cells electrically connected to each adjacent section of each word line in a data bit column as well as the corresponding number of bit lines connected to the memory cells in the data bit column. This number q is referred to herein as the decode number (i.e., a decode q). Each data bit column $15_1$-$15_p$ can, in the case of multiple bit lines (i.e., multiple columns) per data bit column, further include a corresponding multiplexer $16_1$-$16_p$ that receives, as inputs, signals from the bit lines $14_1$-$14_q$ and outputs a single data bit $17_1$-$17_p$, respectively. In such a memory, the number p of data bit columns is the same as the number p of single data bits output and is referred to as the data bit width.

In order to read or write to the memory, a memory address of a set number of bits including bank address bits, which specify a particular one of the banks $11_1$-$11_m$, as well as word address bits and decode address bits, which in combination specify the same memory cell (i.e., the same particular word line and bit line intersection) to be accessed (i.e., read from or written to) in each of the data bit columns. The actual total address space is equal to the number m of banks multiplied by the number n of word lines per bank multiplied by the decode number o per data bit column.

For purposes of illustration, FIG. 1A shows the integrated circuit chip 100 having six discrete memories 150; however, it should be understood that the integrated circuit chip 100 can include any number of two or more memories 150 in other examples. The BIST circuit 101 includes at least one BIST engine 120 controlled by a BIST controller 110. For illustration purposes, FIG. 1A shows two discrete BIST engines controlled by the BIST controller 110; however, it should be understood that the BIST circuit 101 could, alternatively, include any number of BIST engines controlled by the BIST controller 110 in other examples.

At least one BIST engine (e.g., BIST engine 120) in the BIST circuit 101 is electrically connected to multiple memories 150 and can be configured to test those memories in parallel. For illustration purposes, the BIST engine 120 is shown in FIG. 1A as being electrically connected to three memories 150(a), 150(b) and 150(c)); however, it should be understood that BIST engine 120 could, alternatively, be electrically connected to any number of two or more memories in other examples.

The memories 150(a)-(c) can be the same type of memories and can be configured, for example, as illustrated in FIG. 1B. The memories 150(a)-(c) can all be DRAM arrays, SRAM arrays, or any other specific type of memory arrays, etc. Each of the memories 150(a)-(c) can be associated with a predetermined maximum address space. For example, an SRAM array may have a maximum possible size of 16 banks, 512-word lines per bank and a decode number of 32 (i.e., a decode 32) and, thereby a maximum possible address space of 256K addresses (where $1K=2^{10}=1024$). Any other values/limits are possible in other examples.

The memories 150(a)-(c) can have the same configuration (e.g., the same number of banks, the same number of word lines per bank and the same decode number per data bit column such that they each have the same total address space. Alternatively, any two or more of the memories 150(a)-(c) can have different configurations (e.g., different numbers of banks, different numbers of word lines per bank and/or different decode numbers per data bit column) such that they have different total address spaces.

The BIST engine 120 includes an address generator 125 that, during testing, generates test addresses sufficient to automatically sweep through a predetermined maximum address space (e.g., 256K addresses) of the specific type of memory under test. In one or more embodiments of the present invention, the address generator 125 can be limited to generate test addresses within a predetermined range to test particular portions of the memories 150.

The BIST circuit 101 can further include pairs of serially connected input/output interface blocks that electrically connect the multiple memories 150(a)-(c) in parallel to the BIST engine 120 and that enable communication between the BIST engine 120 and the multiple memories 150(a)-(c).

Each pair 130(a)/140(a), 130(b)/140(b), 130(c)/140(c) of serially connected input/output interface blocks can include a first input/output interface block 130(a), 130(b), 130(c) (e.g., a slow BIST input/output interface block (SBIO)) electrically connected to the BIST engine 120 and a second input/output interface block 140(a), 140(b), 140(c) (e.g., a fast BIST input/output interface block (FBIO)) electrically connected between the first input/output interface block 130(a), 130(b), 130(c) and a corresponding memory 150(a), 150(b), 150(c), respectively.

The BIST circuit 101 can further include failing address registers (FARs) 135(a)-(c), which are in communication with the first input/output interface blocks 130(a)-(c) and the second input/output interface blocks 140(a)-(c), respectively, and which are also in communication with the BIST engine 120. The BIST controller 110, the BIST engine 120, the first input/output interface blocks 130(a)-(c) and the FARs 135(a)-(c) can all be controlled by a common first clock signal 191. The memories 150(a)-(c) and the second input/output interface blocks 140(a)-(c) can be controlled by a common second clock signal 192, which is faster than the first clock signal. For example, the second clock signal 192 can be an at-speed functional clock such that BIST operations that are performed with respect to the memories 150(a)-(c) are performed at-speed.

The BIST engine 120 can, via the pairs of input/output interface blocks, sweep through the address spaces of each memory 150(a)-(c), writing the test patterns to the memory cells in the memories 150(a)-(c) at the test addresses generated by the test address generator 125. The BIST engine 120 can subsequently cause the memory cells at the test addresses in the memories 150(a)-(c) to be read and the data out to be analyzed by comparison logic in the second input/output interface block 140(a)-(c) in order to detect any faulty memory cells in any of the memories 150(a)-(c). Upon detection of faulty memory cells in any the memories 150(a)-(c), the corresponding FARs 135(a)-(c) register the failing addresses and can calculate appropriate repair solutions.

Figure 2:
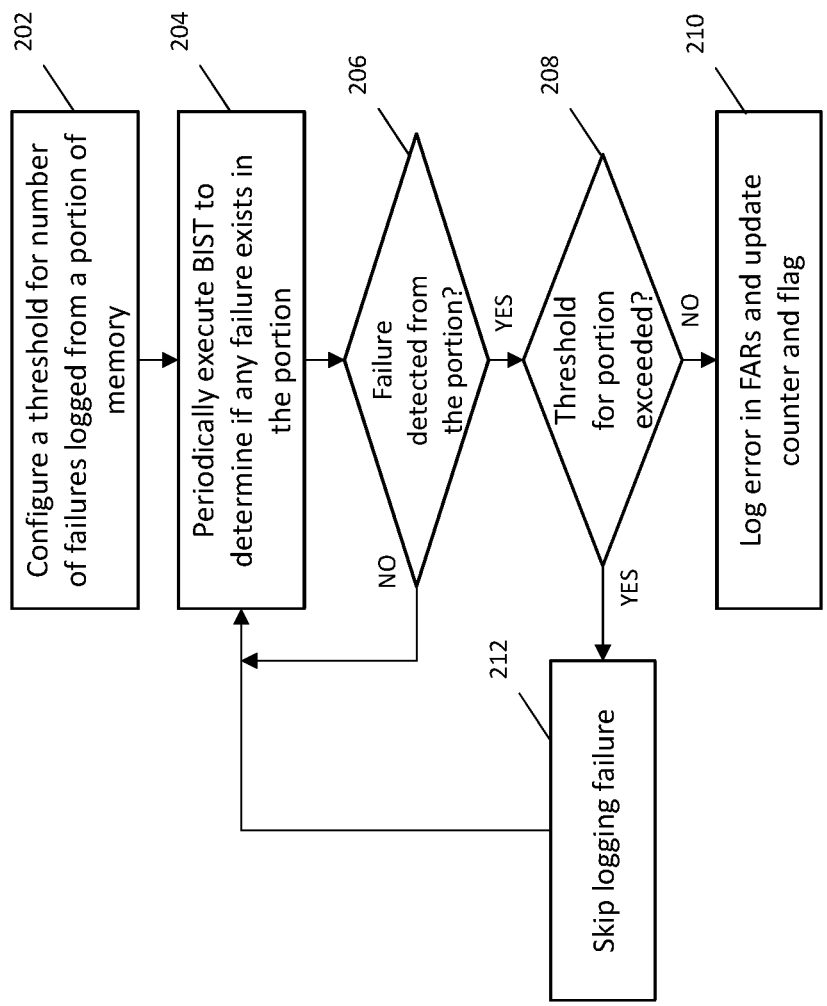
FIG. 2 depicts a flowchart of a method for tracking failures in a memory system using a limited set of failing address registers according to one or more embodiments of the present invention.
Figure 3A:
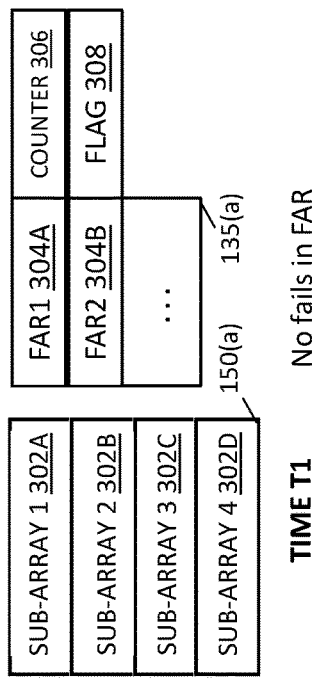
FIG. 3A depicts an example scenario of tracking failures in a memory system.
Figure 3A:
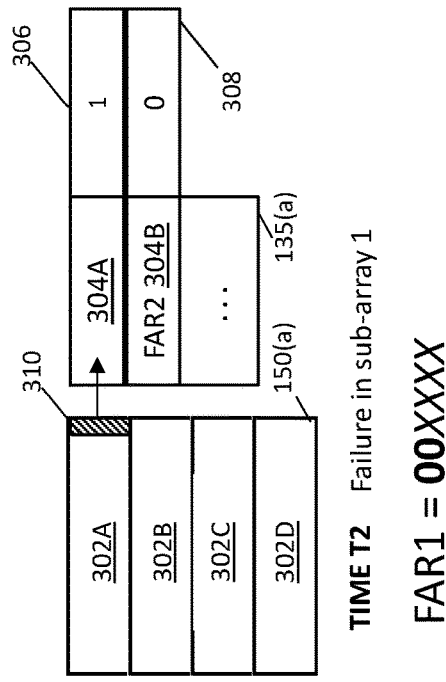
Figure 3B:
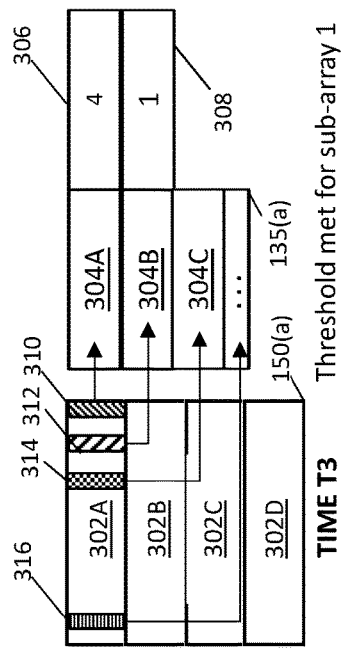
FIG. 3B depicts an example scenario of tracking failures in a memory system.
Figure 3B:
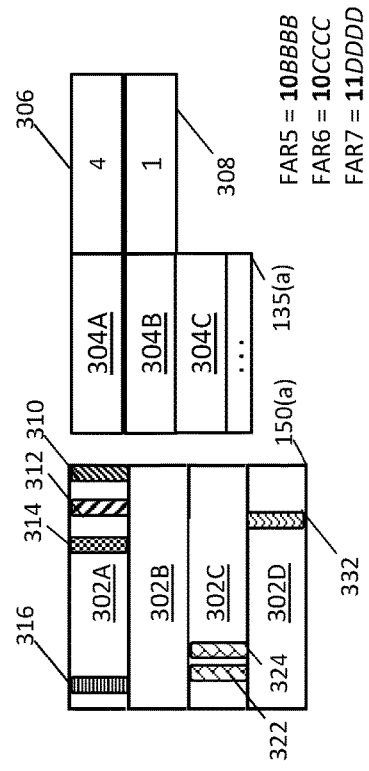

FIG. 2 depicts a flowchart of a method 200 for tracking failures in a memory system using a limited set of FARs according to one or more embodiments of the present invention. FIGS. 3A and 3B depict a walkthrough of an example scenario according to the flowchart of FIG. 2. It is understood that the embodiments of the present invention can operate in various scenarios other than the depicted example scenario.

The method 200 includes associating, with a portion of the memory 150A, a predetermined limit or threshold for the number of errors that are to be logged for that portion, at block 202. For example, the memory 150A can include multiple sub-arrays 302 as shown in FIG. 3A. The portion of the memory 150A that is associated with the predetermined limit can be a sub-array-1 302A in one or more examples. Alternatively, or in addition, the portion can be a set of sub-arrays 302, for example, a sub-array-1 302A and a sub-array-2 302B, and the like. In other embodiments of the present invention, the portion can be formed by any other division of the memory 150A.

The portion that is associated with the predetermined limit is a portion that is associated with a set of FARs 135(a) to log the errors identified with that portion. As depicted, the FARs 135(a) includes multiple failing address registers, FAR-1 304A, FAR-2 304B, and so on. According to one or more embodiments of the present invention, the set of FARs 135(a) is associated with a counter 306. The counter 306 can be a nibble (4 bits), a byte (8 bits), a word (16 bits), or any other length to store an integer. The counter 306 keeps a running count of the number of errors identified in the portion. In one or more examples, the counter 306 is reset when the memory 150(a) is reset.

In one or more embodiments of the present invention, the set of FARs 135(a) is also associated with a flag 308. The flag 308 indicates if the value in the counter 306 exceeds the predetermined limit. In one or more examples, the flag 308 is a binary value (0/1) and can be represented by a bit, a nibble, a byte, or any other circuit to provide the binary value.

Referring to the flowchart of FIG. 2, the method 200 further includes checking for failures in the portion, at block 204. In the example scenario of FIGS. 3A and 3B each of the sub-arrays 302A, 302B, etc. is a "portion." The failures are detected by executing a BIST using the BIST controller 110 as described herein. It should be noted that the manner in which the BIST is executed does not limit the embodiments of the present invention. The BIST is executed periodically as may be configured for the IC 100.

For the method 200, as per the example scenario, at time T1 (FIG. 3) no failures are detected in the portion, at block 206. Accordingly, no changes to the counter 306 and the flag 308 are required. The BIST is periodically executed, at block 204.

Consider that at a time T2 (FIG. 3A) a failure 310 is detected in the portion, at block 206. The method 200 includes checking if the predetermined threshold of a number of failures for the portion has been crossed, at block 208. If the threshold has not been crossed, the failure is logged and the counter 306 and flag 308 are updated, at block 210. For example, logging the error includes storing, in the FAR1 304A, the address associated with the failure 310.

In one or more examples, the address for which the failure is detected indicates whether the failure is in the portion. For example, in the scenario of FIG. 3A/3B, the first two digits of the address identify the sub-array in which the address is located. For example, addresses in the sub-array-1 304A have the prefix '00' (first two digits), the addresses in the sub-array-2 304B start with '01', the addresses in the sub-array-3 304C start with '10', and the addresses in the sub-array-4 304D start with '11'. It is understood that in other embodiments different combination of digits can be used for the different sub-arrays, and/or a different number of digits can be used.

Here, FAR1 304A is the next available free FAR from the set of FARs 135(a). The counter 306 is updated to indicate the number of failures that are detected so far in the portion. At time T2, the counter 306 is now updated to '1' as the failure 310 is the first failure that is detected in the portion. The flag 308 is further updated (if required). Consider that the predetermined threshold is 4, and accordingly, the flag 308 continues to be '0' that indicates that the threshold has not been exceeded.

As the BIST is repeated, at time T3 (FIG. 3B), consider that at least 4 failures (312, 314, 316, and 318) have been detected in the portion, at block 208 in FIG. 2. Corresponding addresses (starting with '00') for the failing locations in the portion are stored in the FARs 135(a). Further, the counter 306 and the flag 308 is updated as described herein. Accordingly, the counter 306 shows 4 and the value of the flag 308 is '1'. If any more failures are detected that are from the portion (at block 206), the failures are not logged (i.e. skip logging failure) in the FARs 135(a), at block 212.

The BIST continues to be executed periodically because failures in other portions of the memory 150(a) can exist and are to be detected, at block 204. As shown in FIG. 3B time T4, failures in the other sub-arrays are logged irrespective of the threshold for the sub-array-1 304A being (or not being) met. For example, failures 322 and 324 in the sub-array-3 302C, which are detected after the threshold for the sub-array-1 302A is exceeded (flag=1), the failures 322 and 324 are logged in the FARs 135(*a*). For example, FARS and FARE (or any other registers) can be populated with the addresses (e.g. 10BBBB and 10CCCC) of the memory locations corresponding to the failures 322 and 324. In a similar manner, if a failure 332 is detected in the sub-array-4 304D, the address (11DDDD) for the failure 332 is stored in FAR7 (or any other register from the FARs 135(*a*)).

In one or more examples, the sub-array-3 304C and the sub-array-4 304D have their respective counters and flags similar to the counter 306 and the flag 308 for the sub-array-1 304A.

Accordingly, method 200 facilitates maintaining a counter that increments every time a failure is encountered within the same memory subsection. The counter is associated with the FARs and a flag is used to indicate if the counter exceeds a predetermined threshold for that subsection. Each such subsection in the memory has a corresponding counter and flag. No new failures are loaded in the FARs after the counter reaches the predetermined threshold (limit), i.e. when the flag is set. Accordingly, the method the failure is prevented from being logged into the FARs.

Figure 4:
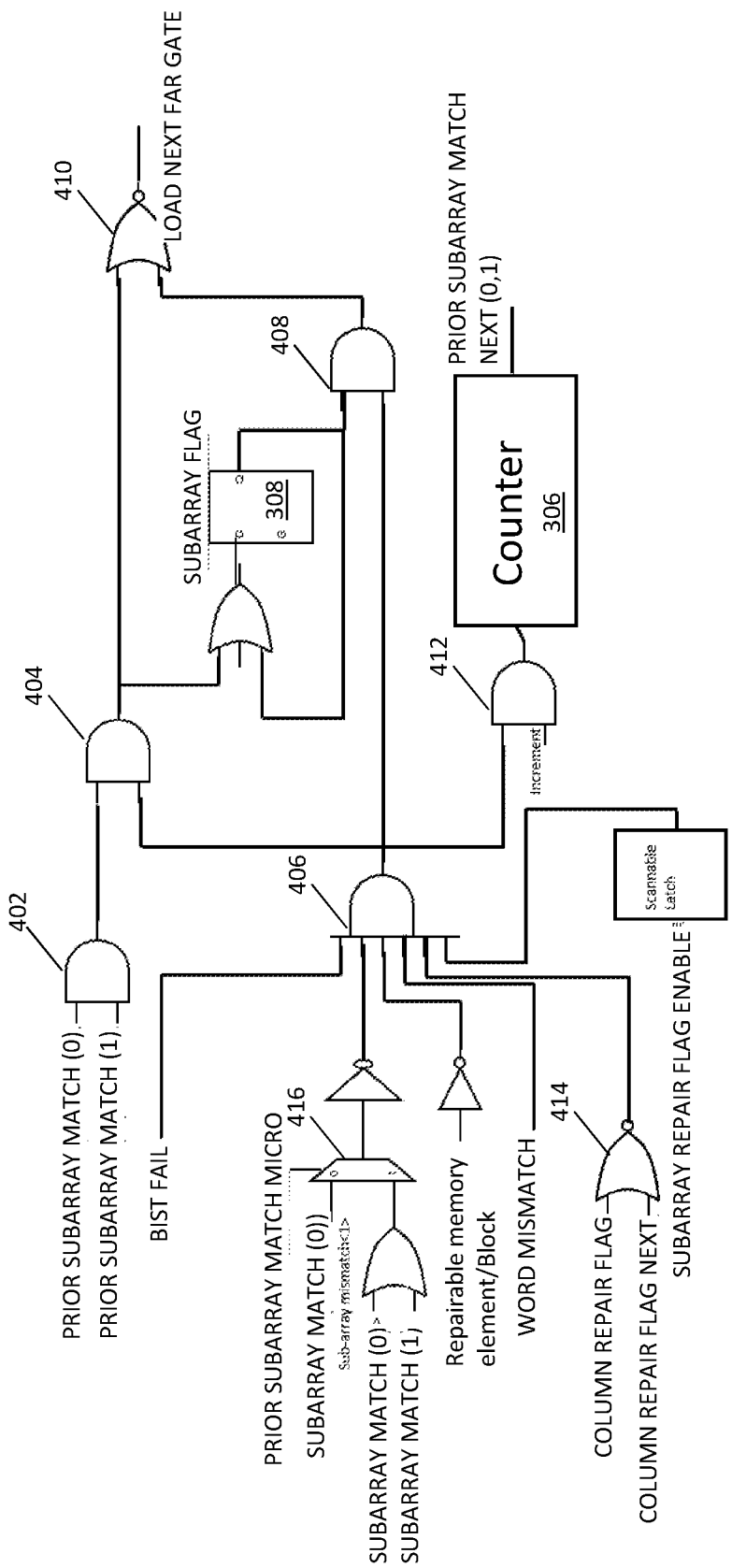
FIG. 4 depicts an example of a circuit for preventing the update of failing address registers for built-in self-tests according to one or more embodiments of the present invention.

FIG. 4 depicts an example of a circuit for preventing the update of failing address registers for built-in self-tests according to one or more embodiments of the present invention. The depicted circuit is for a predetermined threshold of 4 ($11_2$) and where the first two digits of a memory address are used to determine the portion of the memory address. The gate 402 determines whether the value of the counter 306 has reached the predetermined threshold using the two bits of the counter 306. In an example, the gate 402 is an AND gate.

Further, the output of the gate 402 is combined, by the gate 404, with the output of portion determination gate 406. The combination can indicate whether the flag 308 is to be set to 1. The value of the flag 308 and the output of the portion determination gate 406, in conjunction, indicate whether to skip the logging. For example, an AND gate 408 can be used to skip the logging of an identified failure if the flag 308 is 1 and if the portion determination gate 406 indicates that the failure is in the portion associated with the gate 308. A NOR gate 410 logs the failure in the FARs 135(*a*) if neither the counter 306 has reached the threshold nor the flag 308 is 1.

The counter 306 is incremented using a gate 412 based on the output of the portion determination gate 406. The increment can be a predetermined value, e.g. 1.

The portion determination gate 406 receives various input values. The input values include a determination that the memory address at which the BIST failed is within a predetermined range of addresses. The predetermined range of addresses can define the sub-array-1 302A as shown in one or more examples. The number of portions in which the memory 150(*a*) is divided can be configured by programming the predetermined range of addresses. The predetermined range can be programmed using a multiplexer 416 in one or more examples. The multiplexer receives the memory address that is failing and selects n digits of the address and in the figure, for illustration, the first two digits of the address for comparing with those associated with the sub-array-1 302A as described in the present example scenario. It is understood that in other implementations, the multiplexer 416 uses different digits of the address. Based on the selected digits, the multiplexer 416 determines if the failing address is in the sub-array-1 302A (or any other sub-arrays 302) in the memory 150(*a*).

Further, the input values include a result of BIST test, an repairable memory element or block, and a repairable row element of the memory block. In one or more embodiments of the present invention, the portion determination gate 406 also receives a combination 414 of values of a common column repairable element fail in current or prior tests (excluded from the sub array fail counter). If there was a pre-existing column fail or about to be marked as column fail in the same sub array block, it is excluded in the calculation of sub-array max repair count to be compared against the programmed value of sub array block fail count threshold. The programmable subarray repair enable flag is used to enable the sub array repair threshold limit. When this flag is asserted, it enables the sub array repair threshold and when this is not asserted, it disables the repair threshold limit.

It is understood that the logic circuit provided by the FIG. 4 is an example and that various other logic circuits can be used to achieve the same result of updating the counter 306 and the flag 308 as described herein for preventing the logging of the failures once the predetermined threshold is met (or exceeded).

Figure 5:
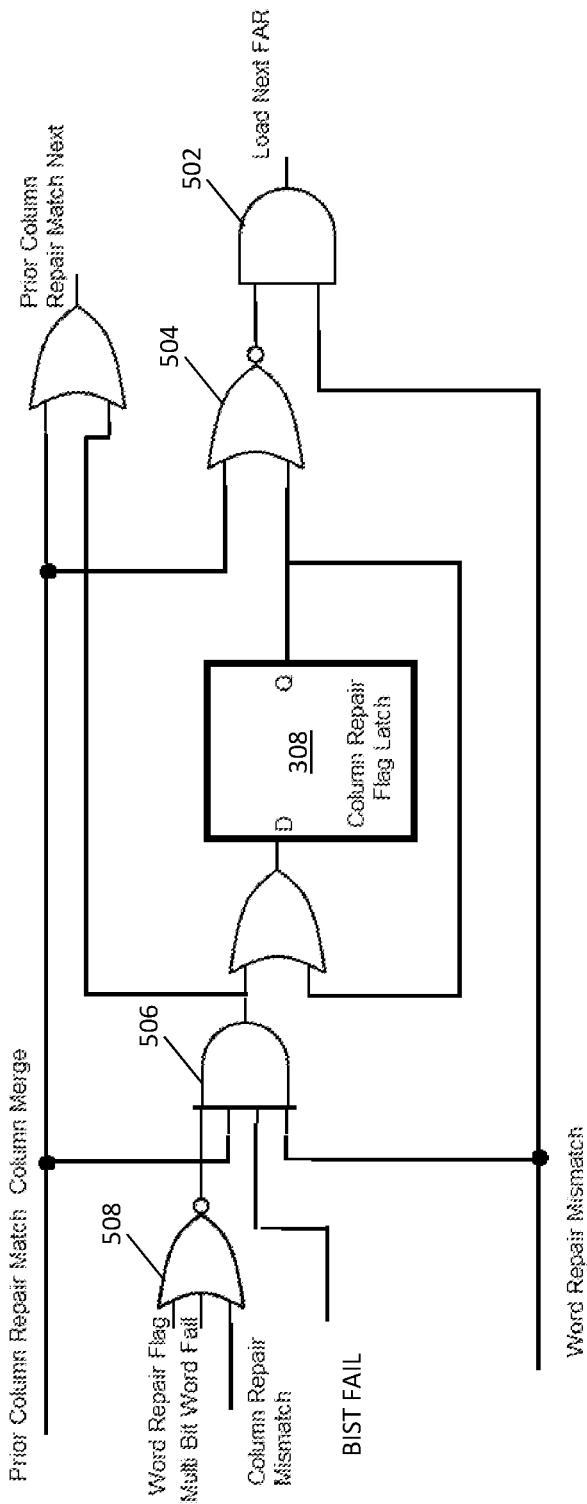
FIG. 5 depicts an example of a circuit for preventing the update of failing address registers for built-in self-tests according to one or more embodiments of the present invention.

FIG. 5 depicts an example of a circuit for preventing update of failing address registers for built-in self-tests according to one or more embodiments of the present invention. Here, a column address is used to prevent loading the FARs 135(*a*) with memory address if at least a predetermined threshold number of failures are detected in memory blocks associated with the same column (bit line 14). Here, instead of the sub-arrays 302, the memory 150(*a*) is divided according to the columns and each column is associated with a respective counter 306 and a respective flag 308.

In the circuit of FIG. 5, the gate 502 indicates if the failing address is to be recorded in the FARs 135(*a*) based on a combination of the value of the flag 308 and a value of the repairable row element of the memory block mismatch signal. In one or more examples, the value of the flag 308 is combined, by a gate 504, with a value of a prior column repair match signal. Prior column repair match represents match of a incoming failing column element matching a pre-existing column repair element.

The flag 308 is updated based on the output of a gate 506. The gate 506 receives, as input, the word repair mismatch, the BIST fail result and the prior column repair match. The word repair mismatch is asserted when the new or incoming failing word address does not match the pre-existing failed word repair address. The flag 308 further receives as input, a combination 508 of the values of the signals: a column repair mismatch, a multibit word fail, and a word repair flag. Column repair mismatch signal is asserted when the incoming fail matched other stored fail for the same column address. Both these signals are used in calculating the flag 308 in order to track the number of fails in a column or row to allocate a column repair or row repair respectively, excluding these from the fails that should count towards the predetermined threshold limit for the sub section of the memory.

The flag 308 can be implemented using a latch as depicted, where the output of the latch is 1 when the number of failures detected on the same column is at least 3 in the depicted embodiment of the present invention.

Embodiments of the present invention described herein facilitate that any failures beyond a preset limit of failures found in adjustable sized memory sub-block are not logged into fail address registers. Any failure observed in the rest of the memory block continues to be logged. According to one or more embodiments of the present invention, a programmable counter is incremented each time a failure is observed from the same memory sub-block. The sub-block size is selectable in one or more embodiments of the present invention. Any failure beyond the preset limit is not logged according to one or more embodiments of the present invention.

Embodiments of the present invention accordingly provide a practical application to the technical challenges described herein in the field of computing technology and particularly electrical circuits used in computing devices, such as memory devices. It is understood that although memory blocks were used in the illustrations herein, the dynamically limiting the addresses logged in failing address registers can be applied to any repairable circuit, including but not limited to IO, logic, SRAM, and DRAM.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

What is claimed is:

1. A computer-implemented method comprising:
   receiving a first memory address that has been identified to be failing, the first memory address located in a first sub-array of a memory;
   receiving a second memory address that has been identified to be failing, the second memory address located in a second sub-array of the memory;
   in response to a number of memory addresses identified to be failing from the first sub-array of the memory being below a predetermined threshold, logging the first memory address in a set of failing address registers associated with the memory; and
   in response to a number of memory addresses identified to be failing from the second sub-array of the memory being above the predetermined threshold, preventing the second memory address from being logged in the set of failing address registers.

2. The computer-implemented method of claim 1, further comprising:
   incrementing a failing address counter associated with the first sub-array in response to receiving the first memory address, the failing address counter indicating a total number of memory locations that are identified to be failing in the first sub-array.

3. The computer-implemented method of claim 1, wherein the first sub-array is represented by a range of memory addresses of the memory.

4. The computer-implemented method of claim 3, wherein the range of memory addresses is programmable.

5. The computer-implemented method of claim 3, wherein the range of memory addresses represent a column of the memory.

6. The computer-implemented method of claim 1, wherein the first memory location is identified to be failing based on a built-in self-test.

7. A system comprising:
   a memory system comprising a plurality of portions; and
   a memory controller communicatively coupled with the memory system, the memory controller configured to perform a method comprising:
   receiving a first memory address that has been identified to be failing, the first memory address located in a first sub-array of a memory;
   receiving a second memory address that has been identified to be failing, the second memory address located in a second sub-array of the memory;
   in response to a number of memory addresses identified to be failing from the first sub-array of the memory being below a predetermined threshold, logging the first memory address in a set of failing address registers associated with the memory; and in response to a number of memory addresses identified to be failing from the second sub-array of the memory being above the predetermined threshold, preventing the second memory address from being logged in the set of failing address registers.

8. The system of claim 7, wherein the method further comprises incrementing a failing address counter associated with the first sub-array in response to receiving the first memory address, the failing address counter indicating a total number of memory locations that are identified to be failing in the first sub-array.

9. The system of claim 7, wherein the first sub-array is represented by a range of memory addresses of the memory system.

10. The system of claim 9, wherein the range of memory addresses is programmable.

11. The system of claim 9, wherein the range of memory addresses represent a column of the memory system.

12. The system of claim 7, wherein the first memory location is identified to be failing based on a built-in self-test of the memory system.

13. A computer program product computer-readable memory that has computer-executable instructions stored thereupon, the computer-executable instructions when executed by a processor cause the processor to perform a method comprising:

receiving a first memory address that has been identified to be failing, the first memory address located in a first sub-array of a memory;

receiving a second memory address that has been identified to be failing, the second memory address located in a second sub-array of the memory;

in response to a number of memory addresses identified to be failing from the first sub-array of the memory being below a predetermined threshold, logging the first memory address in a set of failing address registers associated with the memory; and in response to a number of memory addresses identified to be failing from the second sub-array of the memory being above the predetermined threshold, preventing the second memory address from being logged in the set of failing address registers.

14. The computer program product of claim 13, wherein the method further comprises incrementing a failing address counter associated with the first sub-array in response to receiving the first memory address, the failing address counter indicating a total number of memory locations that are identified to be failing in the first sub-array.

15. The computer program product of claim 13, wherein the first sub-array is represented by a range of memory addresses of the memory.

16. The computer program product of claim 15, wherein the range of memory addresses represent a column of the memory.

17. The computer program product of claim 13, wherein the first memory location is identified to be failing based on a built-in self-test of the memory.

\* \* \* \* \*